United States Patent
Otaka et al.

(10) Patent No.: US 10,341,597 B2
(45) Date of Patent: Jul. 2, 2019

(54) SOLID-STATE IMAGING DEVICE, METHOD FOR MANUFACTURING SOLID-STATE IMAGING DEVICE, AND ELECTRONIC APPARATUS

(71) Applicant: BRILLNICS JAPAN INC., Shinagawa-ku, Tokyo (JP)

(72) Inventors: Toshinori Otaka, Tokyo (JP); Shunsuke Okura, Tokyo (JP); Junichi Nakamura, Tokyo (JP)

(73) Assignee: Brillnics Japan Inc., Tokyo (JP)

( * ) Notice: Subject to any disclaimer, the term of this patent is extended or adjusted under 35 U.S.C. 154(b) by 0 days.

(21) Appl. No.: 15/948,135

(22) Filed: Apr. 9, 2018

(65) Prior Publication Data
US 2018/0294303 A1 Oct. 11, 2018

(30) Foreign Application Priority Data
Apr. 10, 2017 (JP) .................. 2017-077304

(51) Int. Cl.
*H04N 5/369* (2011.01)
*H04N 5/378* (2011.01)
*H01L 27/146* (2006.01)

(52) U.S. Cl.
CPC ....... *H04N 5/379* (2018.08); *H01L 27/14634* (2013.01); *H01L 27/14636* (2013.01); *H01L 27/14683* (2013.01); *H04N 5/378* (2013.01)

(58) Field of Classification Search
CPC ......... H01L 27/14634; H01L 27/14636; H01L 27/14638; H04N 5/369; H04N 5/379
See application file for complete search history.

(56) References Cited

U.S. PATENT DOCUMENTS

| | | | | |
|---|---|---|---|---|
| 2008/0042046 | A1* | 2/2008 | Mabuchi | H01L 27/14634 250/208.1 |
| 2016/0372509 | A1* | 12/2016 | Sekikawa | H01L 21/82 |
| 2017/0033141 | A1* | 2/2017 | Sugihara | H01L 27/14634 |
| 2017/0309667 | A1* | 10/2017 | Yamashita | H01L 27/14636 |
| 2018/0226441 | A1* | 8/2018 | Kondo | H01L 27/146 |

OTHER PUBLICATIONS

Fontaine., "The State-of-Art of Mainstream CMOS Image Sensors", IISW, Jun. 2015, w/English Abstract, Cited in Specification, (4 pages).

(Continued)

*Primary Examiner* — Paul M Berardesca
(74) *Attorney, Agent, or Firm* — Westerman, Hattori, Daniels & Adrian, LLP

(57) ABSTRACT

A solid-state imaging device comprised of a first substrate on which a pixel part is formed and a second substrate on which a column readout circuit is formed along a column level connection part, a row driver is formed along a row level connection part, and a pitch conversion-use interconnect region including a slanted interconnect for pitch conversion among interconnects is formed, the pitch conversion-use interconnect region is formed at least between the end part of the column readout circuit having a third pitch shorter than the pixel part and the end part of the column level connection part and/or between the end part of the row driver having a fourth pitch shorter than the pixel part and the end part of the row level connection part.

16 Claims, 14 Drawing Sheets

(56) References Cited

OTHER PUBLICATIONS

Wakabayashi et al., "A 1/1.7-inch 20Mpixel Back-Illuminated Stacked CMOS Image Sensor with Parallel Multiple Sampling", IISW, Jun. 2015, w/English Abstract, Cited in Specification, (4 pages).
Bosiers et al., "Recent developments on large-area CCDs for professional applications", IISW, Jun. 2015, Cited in Specification, (4 pages).

\* cited by examiner

SOLID-STATE IMAGING DEVICE, METHOD FOR MANUFACTURING SOLID-STATE IMAGING DEVICE, AND ELECTRONIC APPARATUS

CROSS-REFERENCE TO RELATED APPLICATION

The present invention contains subject matter related to Japanese Patent Application JP 2017-77304 filed in the Japan Patent Office on Apr. 10, 2017, the entire contents of which being incorporated herein by reference.

TECHNICAL FIELD

The present invention relates to a solid-state imaging device, a method for manufacturing the solid-state imaging device, and an electronic apparatus.

BACKGROUND ART

As solid-state imaging devices (image sensors) using photoelectric conversion elements detecting light and generating a charge, CMOS (complementary metal oxide semiconductor) image sensors have been put into practical use. CMOS image sensors have been widely applied as parts of digital cameras, video cameras, monitoring cameras, medical endoscopes, personal computers (PC), nubile phones and other portable terminals (nubile devices) and other various types of electronic apparatuses.

A CMOS image sensor, for each pixel, has an FD amplifier having a photodiode (photoelectric conversion element) and floating diffusion layer (FD). The mainstream of reading operations of the same is a column parallel output type that selects a certain row in a pixel part (pixel array part) having pixels arranged therein and simultaneously reads than out to the column output direction.

A column output type CMOS image sensor basically has a pixel part (pixel array part) having a plurality of pixels arranged in a two-dimensional matrix, a row driver (vertical scanning circuit) driving a certain one row so as to read out pixel signals in the row address-designated in the pixel part to the column output direction simultaneously and in parallel, a column readout circuit system (column signal chains) applying predetermined signal processing with respect to the read out signals, and a data output circuit. In the column readout circuit, an AEC and other column signal processing circuits are arranged in a column for each column. Further, each column signal processing circuit in the column readout circuit is arranged corresponding to each column output of the pixel part.

Such a CMOS image sensor can be roughly divided into a pixel array part (pixel part) and a peripheral circuit part including a row driver and column readout circuit etc. Conventionally, the pixel array part and the peripheral circuit part were mounted on the sane chip, that is, the peripheral circuits were mounted on a focal plane. As a result, the chip area (projection area) of the CMOS image sensor ended up becoming larger than the pixel array part originally necessary, therefore the problem arose that a small-sized lens or lens holder could not be used and the camera substrate could not be miniaturized to the utmost limit.

Therefore, in order to solve this type of problem, various chip stacking techniques have been proposed. The chip stacking technique stacks two or more substrates (dies), irrespective of whether they are the sane type or different types, to enable physical connection and electrical connection between the substrates (dies).

In a case study of stacking of a CMOS image sensor shown in NPL 1, a pixel array part, column level and row level TSVs, and I/O pad are mounted on a first substrate (CIS die) on which light is incident and column signal chains forming a column readout circuit, row driver, and other peripheral circuits are mounted on a second substrate (ASIC die) on a lower side in the stacking direction.

Further, in the case study of stacking of a CMOS image sensor shown in NPL 2, two, i.e., upper and lower, groups of column signal chains having a finer pitch than the pixels are mounted on and under the second substrate (ASIC die) thereby raising the speed and suppressing increase of the vertical and horizontal sizes.

On the other hand, in the case of the CMOS image sensor shown in NPL 3, it is seen that even if the stacking technique is not used, most of the focal plane is occupied by the pixel array, therefore the ratio of the peripheral circuits is very small. In such a configuration, the optical center, the center of the pixel array, and the center of the chip are positioned at substantially the sane coordinates, therefore excessive space for matching optical axes becomes unnecessary and use of the smallest lens holder becomes possible.

CITATION LIST

Non-Patent Literature

NPL 1: Ray Fontaine, "The State-of-Art of Mainstream CMOS image sensors," IISW, June 2015.
NPL 2: Hayato Wakabayashi et al., "A 1/1.7-inch 20 Mpixel Back-Illuminated Stacked CMOS Image Sensor with Parallel Multiple Sampling," IISW, June 2015.
NPL 3: Jan Bosiers et al., "Recent developments on large-area CCDs for professional applications," IISW, June 2015.

SUMMARY OF INVENTION

Technical Problem

In the case study of stacking of a CMOS image sensor shown in NPL 1 explained above, the column signal chains are mounted with a finer pitch than the pixels. However, a pitch conversion-use interconnect region is mounted on the first substrate (CIS die). There are regions other than the pixel array part from the upper edge (upper side) of the planarly rectangular pixel array part to the upper edge (upper side) of the chip. Further, the row driver is mounted with the sane pitch as the pixel part, therefore the lateral width of the chip increases further than the width of the I/O driver adjacent to the row driver.

Further, in the case study of stacking of the CMOS image sensor shown in NPL 2, a row driver having the sane pitch as the pixel part is mounted on the first substrate (CIS die), therefore the chip projection area becomes larger than the lateral width of the pixel array by exactly the width of the high speed serial interface I/O circuit.

The present invention provides a solid-state imaging device capable of realizing the smallest chip projection area which can be realized by the image sensor with an equal size to the pixel array, a method for manufacturing the solid-state imaging device, and an electronic apparatus.

Solution to Problem

A solid-state imaging device of a first aspect of the present invention comprises a pixel part having a plurality of pixels performing photoelectric conversion arranged in a matrix, a reading part reading pixel signals from the pixel part to a column output direction, a first substrate, and a second substrate, wherein the reading part includes at least a row driver which drives a row designated in the pixel part so as to read out pixel signals in the row to the column output direction, and a column readout circuit applying predetermined signal processing with respect to the signals read out in response to driving of the row driver, the first substrate and the second substrate have a multilayer structure in which they are connected through a column level connection part which is formed in at least one side portion of the column output direction of each substrate and through a row level connection part which is formed in at least one side portion of a direction perpendicular to the column output direction of each substrate, on the first substrate, a pixel part is formed, in which pixel part, the side portion along the column level connection part of the column output direction has a first pitch, and the side portion along the row level connection part of the direction perpendicular to the column output direction has a second pitch, on the second substrate, at least, the column readout circuit with a side portion of the column output direction having a third pitch corresponding to the first pitch is formed along the column level connection part, and the row driver with a side portion of the direction perpendicular to the column output direction having a fourth pitch corresponding to the second pitch is formed along the row level connection part, and a pitch conversion-use interconnect region including a slanted interconnect for pitch conversion between interconnects is formed, at least one of the third pitch of the column readout circuit or the fourth pitch of the row driver on the second substrate is shorter than the corresponding first pitch or second pitch of the pixel part on the first substrate, and the pitch conversion-use interconnect region is formed at least between the end part of the column readout circuit having the third pitch shorter than the pixel part and the end part of the column level connection part, and/or between the end part of the row driver having the fourth pitch shorter than the pixel part and the end part of the row level connection part.

A second aspect of the present invention is a method for manufacturing a solid-state imaging device comprising a pixel part having a plurality of pixels performing photoelectric conversion arranged in a matrix, a reading part reading pixel signals from the pixel part to the column output direction, a first substrate, and a second substrate, wherein the reading part includes at least a row driver which drives the row designated in the pixel part so as to read out the pixel signals in the row to the column output direction and a column readout circuit applying predetermined signal processing with respect to the signals read out in response to driving of the row driver, and the first substrate and the second substrate have a multilayer structure in which they are connected through a column level connection part which is formed in at least one side portion of the column output direction of each substrate and through a row level connection part which is formed in at least one side portion of the direction perpendicular to the column output direction of each substrate, the method for manufacturing a solid-state imaging device comprising on the first substrate, forming a pixel part with a side portion along the column level connection part of the column output direction having a first pitch and with a side portion along the row level connection part of the direction perpendicular to the column output direction having a second pitch, processing the second substrate to at least form along the column level connection part a column readout circuit with a side portion of the column output direction having a third pitch corresponding to the first pitch, forming along the row level connection part a row driver with a side portion of the direction perpendicular to the column output direction having a fourth pitch corresponding to the second pitch, forming a pitch conversion-use interconnect region including a slanted interconnect for pitch conversion between interconnects, and making at least one of the third pitch of the column readout circuit or the fourth pitch of the row driver on the second substrate shorter than the corresponding first pitch or second pitch of the pixel part on the first substrate, and forming the pitch conversion-use interconnect region at least between the end part of the column readout circuit having the third pitch shorter than the pixel part and the end part of the column level connection part, and/or between the end part of the row driver having the fourth pitch shorter than the pixel part and the end part of the row level connection part.

An electronic apparatus of a third aspect of the present invention has a solid-state imaging device and an optical system forming a subject image in the solid-state imaging device, wherein the solid-state imaging device comprises a pixel part having a plurality of pixels performing photoelectric conversion arranged in a matrix, a reading part reading the pixel signals from the pixel part to the column output direction, a first substrate, and a second substrate, the reading part includes at least a row driver which drives the row designated in the pixel part so as to read out the pixel signals in the row to the column output direction and a column readout circuit applying predetermined signal processing with respect to the signals read out in response to driving of the row driver, the first substrate and the second substrate have a multilayer structure in which they are connected through a column level connection part which is formed in at least one side portion of the column output direction of each substrate and through a row level connection part which is formed in at least one side portion of the direction perpendicular to the column output direction of each substrate, on the first substrate, a pixel part is formed, in which pixel part, the side portion along the column level connection part of the column output direction has a first pitch, and the side portion along the row level connection part of the direction perpendicular to the column output direction has a second pitch, on the second substrate, at least, a column readout circuit with a side portion of the column output direction having a third pitch corresponding to the first pitch is formed along the column level connection part, a row driver with a side portion of a direction perpendicular to the column output direction having a fourth pitch corresponding to the second pitch is formed along the row level connection part, a pitch conversion-use interconnect region including a slanted interconnect for pitch conversion between interconnects is formed, at least one of the third pitch of the column readout circuit or the fourth pitch of the row driver on the second substrate is shorter than the corresponding first pitch or second pitch of the pixel part on the first substrate, and the pitch conversion-use interconnect region is formed at least between the end part of the column readout circuit having the third pitch shorter than the pixel part and the end part of the column level connection part and/or between the end part of the row driver having the fourth pitch shorter than the pixel part and the end part of the row level connection part.

Advantageous Effect of Invention

According to the present invention, it is possible to realize the smallest chip projection area which can be realized by an image sensor with an equal size to the pixel array.

DESCRIPTION OF EMBODIMENTS

Below, embodiments of the present invention will be explained with reference to the drawings.

First Embodiment

Figure 1:
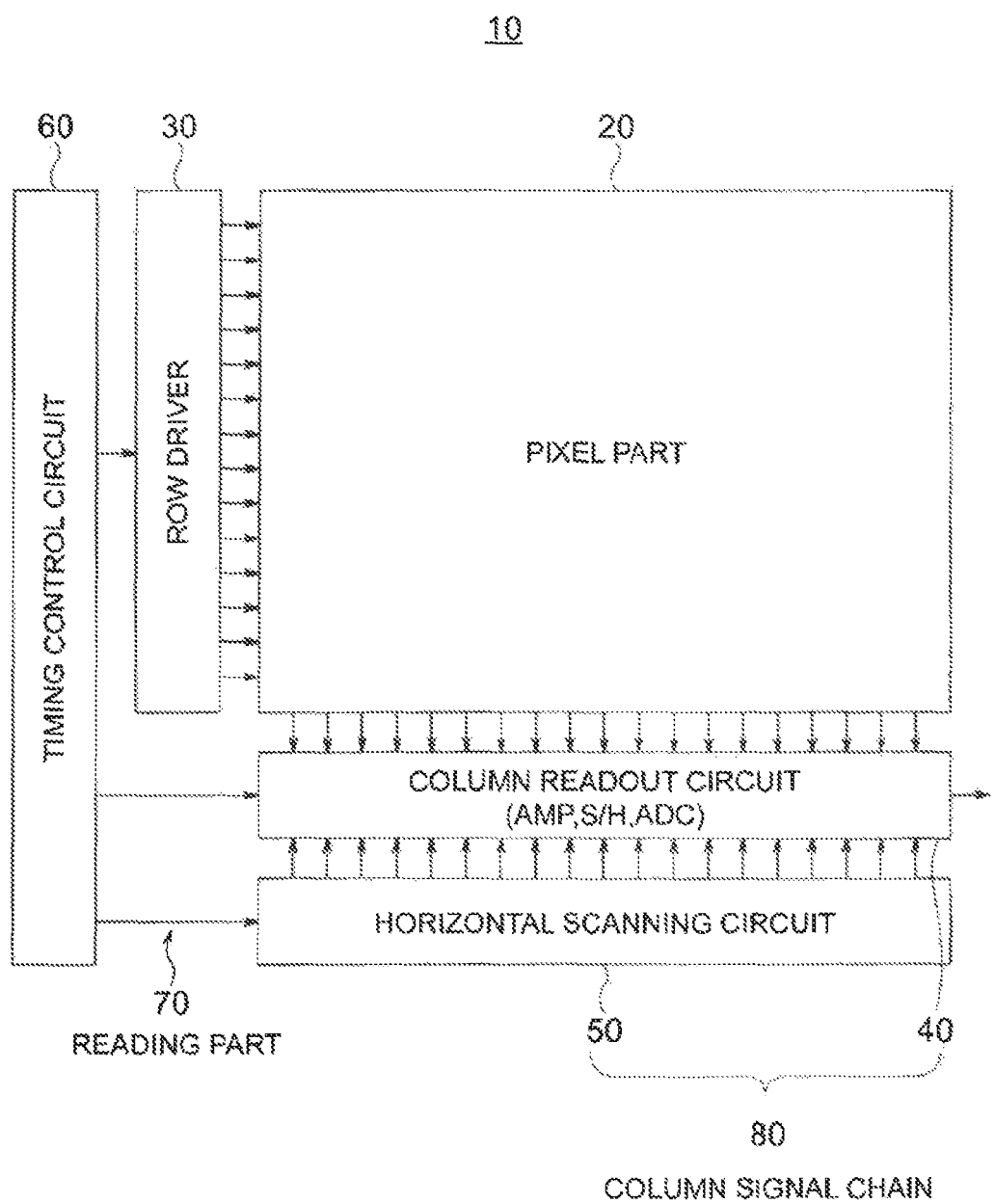
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is for example configured by a CMOS image sensor.

This solid-state imaging device 10, as shown in FIG. 1, has an imaging part constituted by a pixel part (pixel array part) 20, a row driver (vertical scanning circuit or row scanning circuit) 30, column readout circuit 40, horizontal scanning circuit (column scanning circuit) 50, and timing control part 60 as principal components. Among these components, for example, the row driver 30, column readout circuit 40, horizontal scanning circuit 50, and timing control circuit 60 configure a reading part 70 of pixel signals. Further, in the first embodiment, a column signal chain 80 forming a column readout circuit system is constituted by the column readout circuit 40 and horizontal scanning circuit 50 etc.

In the first embodiment, the solid-state imaging device 10, as will be explained in detail later, is configured as a multilayer type CMOS image sensor having the first substrate and second substrate. The solid-state imaging device 10 in the first embodiment has a multilayer structure in which the first substrate and the second substrate are connected through a column level connection part which is formed in at least one side portion between the two side portions of the column output direction (interconnect direction of vertical signal line) of each substrate and through a row level connection part which is formed in at least one side portion of the direction perpendicular to the column output direction of each substrate.

On the first substrate, the pixel part 20 is formed. Further, in the pixel part 20, the side portion along the column level connection part of the column output direction has a first pitch, and the side portion along the row level connection part of the direction perpendicular to the column output direction has a second pitch. On the second substrate, along the column level connection part, a column signal chain 80 including a column readout circuit 40 with a side portion of the column output direction having a third pitch corresponding to the first pitch of the pixel part 20 is formed, while along the row level connection part, a row driver 30 with a side portion of a direction perpendicular to the column output direction having a fourth pitch corresponding to the second pitch is formed. On the second substrate, a pitch conversion-use interconnect region including a slanted interconnect for pitch conversion between interconnects is formed.

In the first embodiment, on the second substrate, the two pitches of the third pitch of the column signal chain 80 and the fourth pitch of the row driver 30 are set shorter than the corresponding first pitch and second pitch of the pixel part 20 on the first substrate. Further, in the first embodiment, the pitch conversion-use interconnect region is at least formed between the end part of the column signal chain 80 having the third pitch shorter than the pixel part 20 and the end part of the column level connection part and between the end part of the row driver 30 having the fourth pitch shorter than the pixel part 20 and the end part of the row level connection part.

Below, outlines of the configurations and functions of the parts in the solid-state imaging device 10, particularly the configuration and function of the pixel part 20, and the multilayer structure etc. of the pixel part 20 and the reading part 70 will be explained in detail.

Configurations of Pixel PXL and Pixel Part 20

Figure 2:
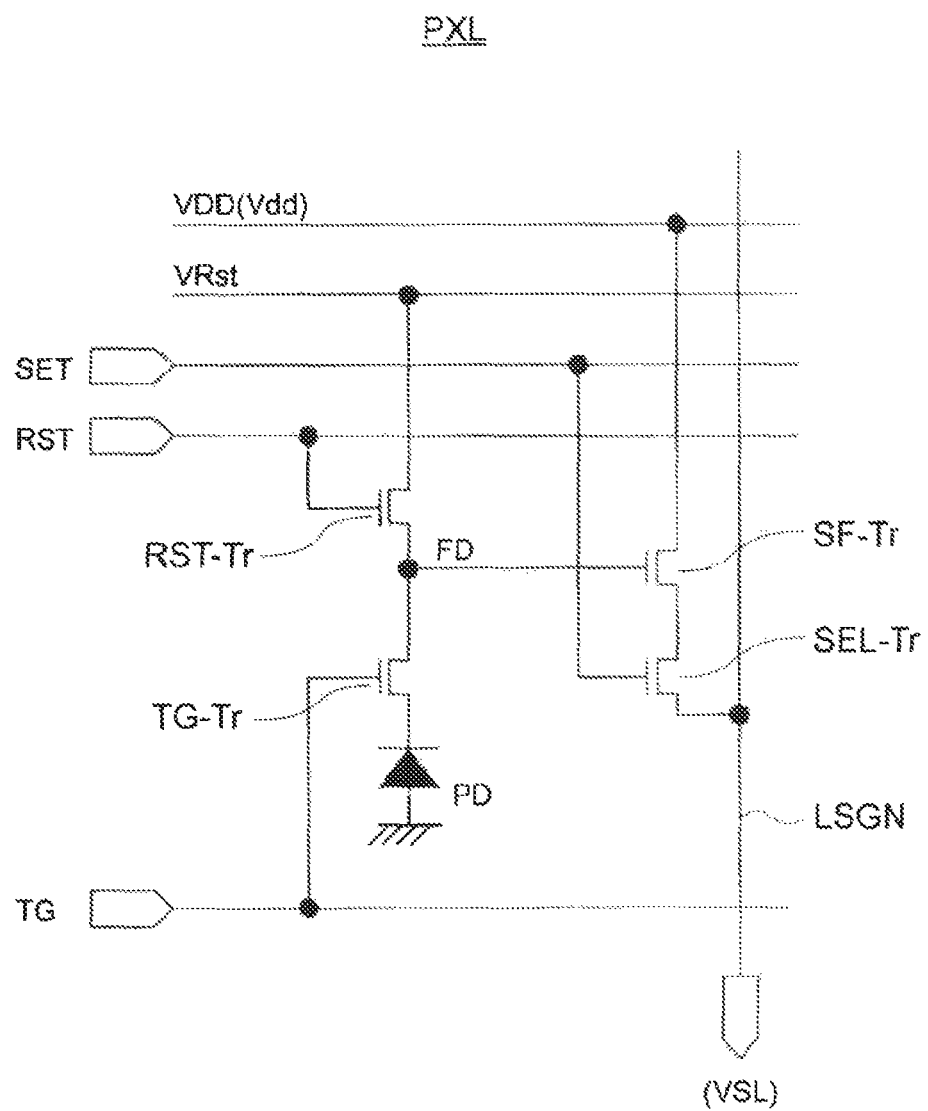
FIG. 2 is a block diagram showing an example of the configuration of a pixel in the solid-state imaging device according to the first embodiment of the present invention.

FIG. 2 is a circuit diagram showing an example of the configuration of a pixel in the solid-state imaging device 10 according to the first embodiment of the present invention.

The pixel PXL is comprised including a photodiode (photoelectric conversion element) and an in-pixel amplifier. Specifically, this pixel PXL has for example a photoelectric conversion element constituted by a photodiode PD. For this photodiode PD, one each of a transfer element constituted by a transfer transistor TG-Tr, a reset element constituted by a reset transistor RST-Tr, a source-follower element constituted by a source-follower transistor SF-Tr, and a selection element constituted by a selection transistor SEL-Tr are provided. In this way, the pixel PXL according to the first embodiment is configured including a four-transistor (4Tr) pixel of the transfer transistor TG-Tr, reset transistor RST-Tr, source-follower transistor SF-Tr, and selection transistor SEL-Tr.

The photodiode PD generates a signal charge (here, electrons) in an mount in accordance with the incident light quantity and stores the same. Below, an explanation will be given of a case where the signal charge is comprised of electrons and each transistor is an n-type transistor, but the signal charge may be comprised of holes and each transistor may also be a p-type transistor. Further, the present embodiment is effective also in a case where each transistor is shared wrong a plurality of photodiodes and transfer transistors and a case where a three-transistor (3Tr) pixel not having a selection transistor is employed.

The transfer transistor TG-Tr is connected between the photodiode PD and the floating diffusion FD and is controlled by a control signal TG supplied through the control line to the gate. The transfer transistor TG-Tr is selected in a transfer period where the control signal TG is a high level (H) and becomes a conductive state and transfers the charge (electrons) which is photoelectrically converted and accumulated in the photodiode PD to the floating diffusion FD.

The reset transistor RST-Tr, as shown in FIG. 2, is connected between the power supply line VRst and the floating diffusion FD and is controlled by a control signal RST supplied through the control line to the gate. Note that, the reset transistor RST-Tr may be configured so that it is connected between the power supply line Vdd for the power supply voltage VDD and the floating diffusion FD and is controlled by the control signal RST supplied through the control line to the gate as well. The reset transistor RST-Tr is selected in a reset period where the control signal RST is an H level and becomes a conductive state and resets the floating diffusion FD to the potential of the power supply line VRst or the power supply line Vdd of the power supply voltage VDD.

The source-follower element constituted by the source-follower transistor SF-Tr and the selection transistor SEL-Tr are connected in series between the power supply line Vdd and the vertical signal line LSGN.

To the gate of the source-follower transistor SF-Tr is connected the floating diffusion FD. The selection transistor SEL-Tr is controlled by a control signal SEL which is supplied through the control line to the gate. The selection transistor SEL-Tr is selected in a selection period where the control signal SEL is an H level and becomes a conductive state. Due to this, the source-follower transistor SF-Tr outputs a read-out signal (VSIG1) of the column output obtained by converting the charge in the floating diffusion FD to a voltage signal in accordance with the charge mount (potential) and a readout reset signal (VRST1) to the vertical signal line LSGN. These operations are carried out simultaneously in parallel for 1 row's worth of the pixel since the gates of for example transfer transistor TG-Tr, reset transistor RST-Tr, and selection transistor SEL-Tr are connected in units of rows.

In the pixel part 20, the pixels PXL are arranged in N rows and M columns, therefore there are N signal lines for each of the control signals SEL, RST, and TG, and there are M vertical signal lines LSGN. In FIG. 1, the signal lines for the control signals SEL, RST, and TG are represented as one row scanning control line.

The row driver (vertical scanning circuit) 30 drives the pixels PXL through the row scanning control line in the shutter row and readout row in accordance with the control of the timing control circuit 60. Further, the row driver 30, according to the address signal, outputs a row selection signal having row addresses of a read row for performing a reading operation of the signal and a shutter row for resetting the charge accumulated in the photodiode PD21. That is, the row driver 30 drives the pixels PXL so as to read out the pixel signals in the address-designated row in the pixel part 20 to the column output direction (interconnect direction of the vertical signal line LSGN).

The column readout circuit 40 may be configured including a plurality of column signal processing circuits (not shown) arranged corresponding to the column outputs in the pixel part 20 so that column parallel processing among a plurality of column signal processing circuits is possible.

The column readout circuit 40 can be configured including correlated double sampling (CDS) circuits or ADC (analog-to-digital converters: AD converters), amplifiers (AMP), sample/hold (S/H) circuits, etc.

Figure 3A:
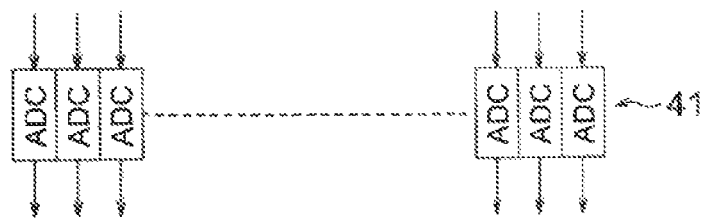
FIG. 3A to FIG. 3C are diagrams for explaining an example of the configuration of a column output read-out system of a pixel part in the solid-state imaging device according to the embodiment of the present invention.
Figure 3B:
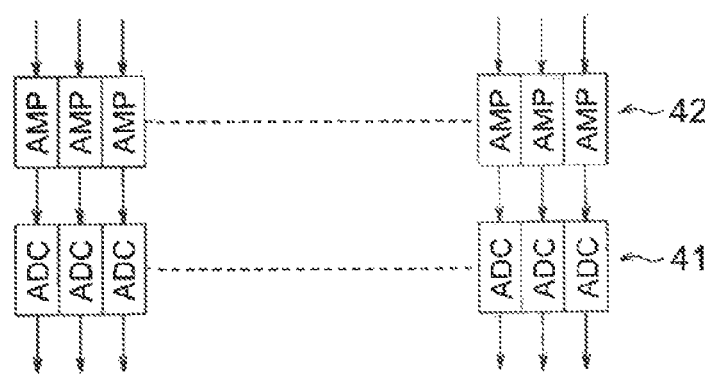
Figure 3C:
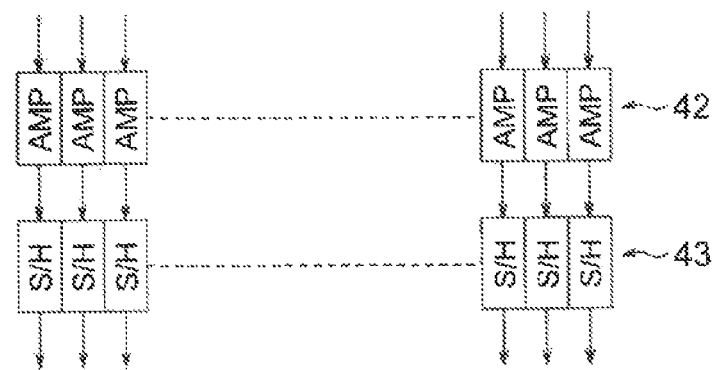

In this way, the column readout circuit 40, for example, as shown in FIG. 3A, may include ADCs 41 for converting the read-out signals VSL of the column outputs of the pixel part 20 to digital signals. Alternatively, in the column readout circuit 40, for example as shown in FIG. 3B, amplifiers (AMP) 42 for amplifying the read-out signals VSL of column outputs of the pixel part 20 may be arranged as well. Further, in the readout circuit 40, for example, as shown in FIG. 3C, sample/hold (S/H) circuits 43 for sampling and holding the read-out signals VSL of column outputs of the pixel part 20 may be arranged as well.

The horizontal scanning circuit 50 scans signals processed in the plurality of column signal processing circuits such as ADCs in the readout circuit 40, transfers the results to the horizontal direction, and outputs the same to a not shown signal processing circuit.

The timing control circuit 60 generates timing signals which are necessary for signal processing in the pixel part 20, row driver 30, column readout circuit 40, horizontal scanning circuit 50, etc.

In the first embodiment, the reading part 70 accesses the pixels of the pixel part 20 in order and performs a reading operation of pixel signals in units of rows.

Multilayer Structure of Solid-State Imaging Device 10

Next, the multilayer structure of the solid-state imaging device 10 according to the first embodiment will be explained.

Figure 4:
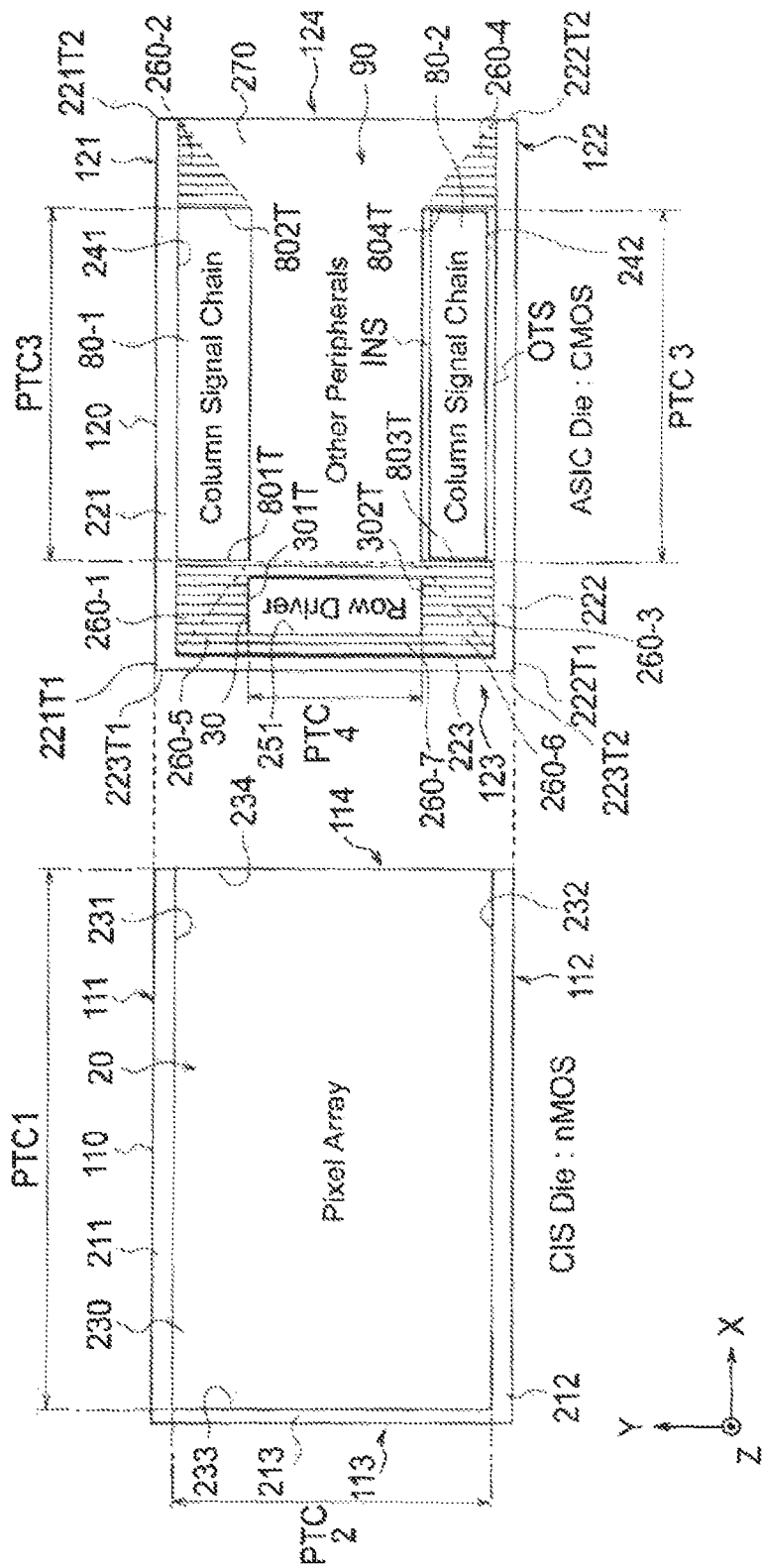
FIG. 4 is a diagram for explaining a multilayer structure of the solid-state imaging device according to the first embodiment of the present invention.

FIG. 4 is a diagram for explaining the multilayer structure of the solid-state imaging device 10 according to the first embodiment of the present invention.

The solid-state imaging device 10 according to the first embodiment has the multilayer structure of a first substrate (upper substrate) 110 and a second substrate (lower substrate) 120. The solid-state imaging device 10 is formed as an imaging device of a multilayer structure formed by for example bonding the substrates to each other at a wafer level, then cutting them out by dicing. The present example is structured with the first substrate 110 stacked on the second substrate 120.

In the solid-state imaging device 10 in the first embodiment, on the first substrate 110, column level connection parts 211 and 212 are formed in two side portions 111 and 112 of the column output direction (interconnect direction of the vertical signal line LSGN, i.e., Y-direction in the orthogonal coordinate system in the figure), and a row level connection part 213 is formed in one side portion 113 between two side portions 113 and 114 of the direction (X-direction) perpendicular to the column output direction. In the sane way, on the second substrate 120, column level connection parts 221 and 222 are formed in two side portions 121 and 122 of the column output direction (Y-direction), and a row level connection part 223 is formed in one side portion 123 between two side portions 123 and 124 of the direction (X-direction) perpendicular to the column output direction. Further, the solid-state imaging device 10 in the first embodiment has a multilayer structure comprised of the first substrate 110 and the second substrate 120 connected by for example stacking-use vias between chips (die-to-die vias) or micro-bumps through the column level connection parts 211 and 212 and the column level connection parts 221 and 222 which are individually formed on the substrates and correspond to each other and through their row level connection part 213 and row level connection part 223 corresponding to each other.

On the first substrate 110, as shown in FIG. 4, a pixel array 230 having pixels PXL of the pixel part 20 arranged therein is formed covering the entire first substrate 110.

In this way, on the first substrate 110, the pixel array 230 is formed in a rectangular shape as the pixel part 20. Further, the pixel array 230 used as the pixel part 20 is formed in a square shape with side portions 231 and 232 along the column level connection parts 211 and 212 of the column output direction (Y-direction) having a first pitch PTC1 and with side portions 233 and 234 along the row level connection part 213 of the direction (X-direction) perpendicular to the column output direction having a second pitch PTC2.

On the second substrate 120, along the column level connection parts 221 and 222, column signal chains 80-1 and 80-2 each including a column readout circuit 40 with side portions 241 and 242 of the column output direction (Y-direction) having a third pitch PTC3 corresponding to the first pitch PTC1 of the pixel part 20 are formed. On the second substrate 120, along the row level connection part 223, a row driver 30 with a side portion 251 of the direction (X-direction) perpendicular to the column output direction having a fourth pitch PTC4 corresponding to the second pitch PTC2 of the pixel part 20 is formed. On the second substrate 120, pitch conversion-use interconnect regions 260-1 to 260-7 including slanted interconnects for pitch conversion wrong interconnects are formed.

Further, on the second substrate 120 in the first embodiment, the central part of the substrate and the region in the vicinity of the side portions 124 other than the regions for forming the column signal chains 80-1 and 80-2, the region for forming the row driver 30, and the regions for forming the pitch conversion-use interconnect regions 260-1 to 260-7, are assigned as the regions for forming other peripheral circuits 90 such as the output circuits excluding the column signal chains 80-1 and 80-2 and row driver 30.

In the first embodiment, the third pitch PTC3 of the column signal chains 80-1 and 80-2 on the second substrate 120 is set shorter (narrower) than the corresponding first pitch PTC1 of the pixel part 20 on the first substrate 110 (PTC3<PTC1). Further, the fourth pitch PTC4 of the row driver 30 on the second substrate 120 is set shorter (narrower) than the corresponding second pitch PTC2 of the pixel part 20 on the first substrate (PTC4<PTC2).

In the first embodiment, the pitch conversion-use interconnect regions 260 (−1 to −7) are formed by using an interconnect layer which is different from a metal interconnect layer used for the column signal chains 80-1 and 80-2 and row driver 30. Accordingly, it is possible to arrange the pitch conversion-use interconnect regions 260 (−1 to −7) so that they overlap the column signal chains 80-1 and 80-2 and row driver 30 in the stacking direction (Z-direction).

Further, in the first embodiment, the pitch conversion-use interconnect region 260-1 including the slanted interconnects is formed between an end part 801T of the column signal chain 80-1 having the third pitch PTC3 shorter than the first pitch PTC1 of the pixel part 20 and one end part 221T1 of the column level connection part 221. The pitch conversion-use interconnect region 260-2 including the slanted interconnects is formed between an end part 802T of the column signal chain 80-1 having the third pitch PTC3 shorter than the first pitch PTC1 of the pixel part 20 and the other end part 221T2 of the column level connection part 221. The slanted interconnects in the pitch conversion-use interconnect regions 260-1 and 260-2 are individually laid from the end parts 221T1 and 221T2 of the column level connection part 221 up to the positions which match with the positions of the end parts 801T and 802T of the column signal chain 80-1.

Figure 5:
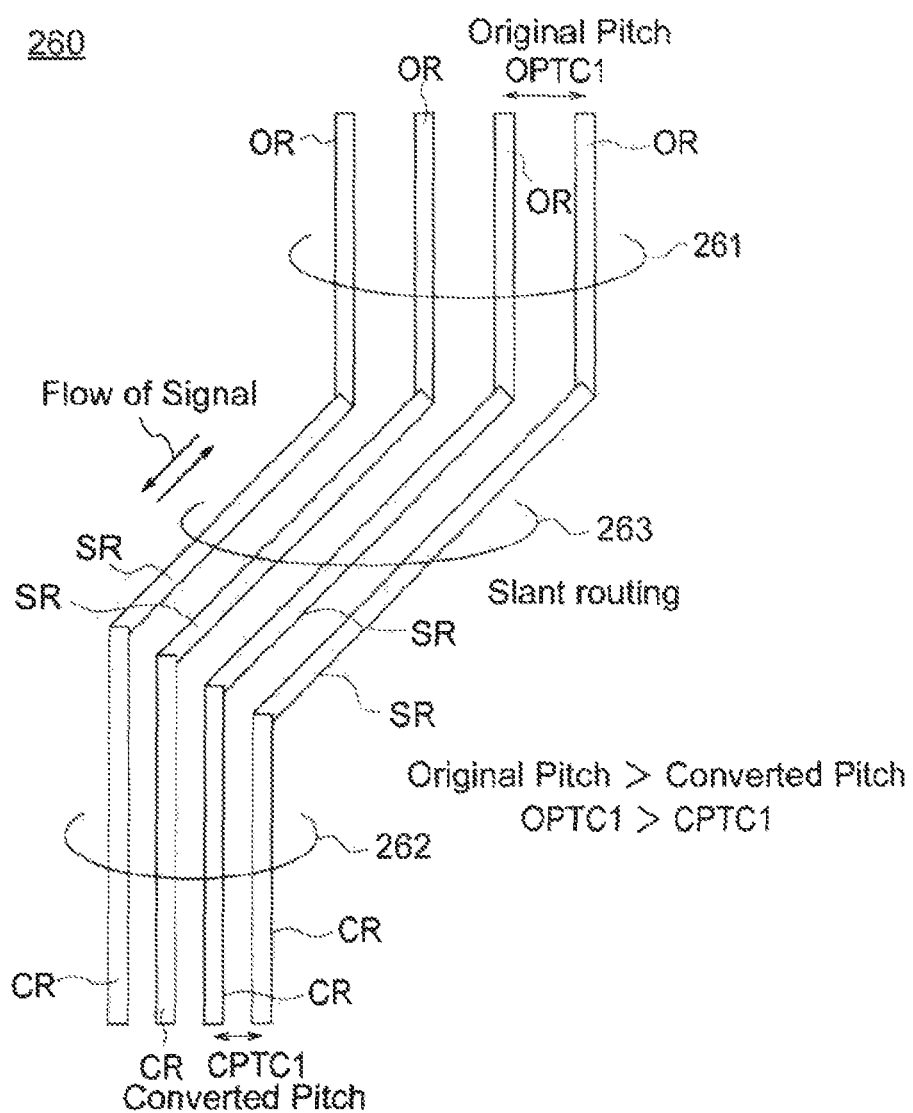
FIG. 5 is a diagram showing an example of a fundamental configuration of a pitch conversion-use interconnect region including a slanted interconnect according to the first embodiment of the present invention.
Figure 6:
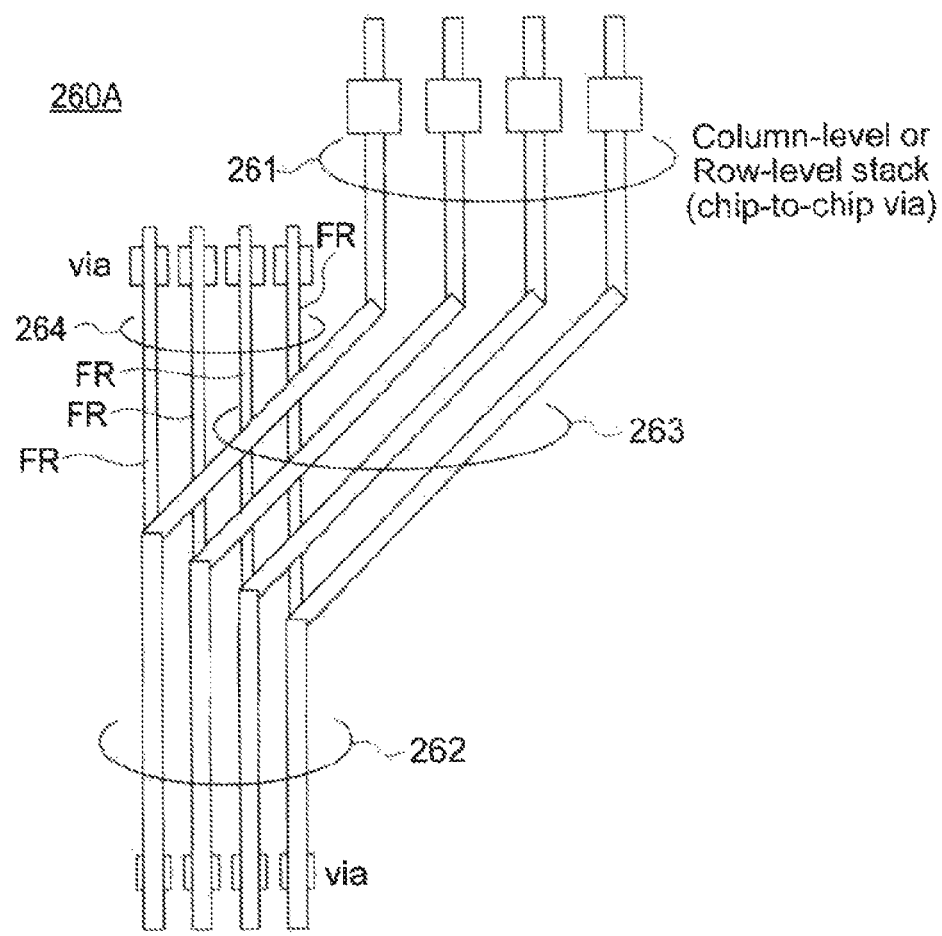
FIG. 6 is a diagram showing an example of the configuration of pitch conversion interconnects including a slanted interconnect and bent interconnect according to the first embodiment of the present invention.

FIG. 5 is a diagram showing an example of the fundamental configuration of a pitch conversion-use interconnect region including slanted interconnects according to the first embodiment of the present invention. FIG. 6 is a diagram showing an example of the configuration of a pitch conversion-use interconnect region including slanted interconnects and bent interconnects according to the first embodiment of the present invention.

The pitch conversion-use interconnect region 260, as shown in FIG. 5, is configured including a first interconnect group 261 with interconnects OR formed with a pitch OPTC1, a second interconnect group 262 with interconnects CR formed with a pitch CPTC1 shorter (narrower) than the pitch OPTC1, and a slanted interconnect group 263 which connects the interconnects OR in the first interconnect group 261 and the corresponding interconnects CR in the second interconnect group 262 by slanted interconnects SR and thereby converting the pitch OPTC1 to the pitch CPTC1 which is shorter (narrower) than this pitch OPTC1 or converting the pitch CPTC1 to the pitch OPTC1 which is longer (broader) than this pitch CPTC1.

In the pitch conversion-use interconnect region 260, when applied to for example the column signal chains 80-1 and 80-2, the flow of signals is as follows: The signals are transferred from the first interconnect group 261 to the slanted interconnect group 262, the pitch OPTC1 of interconnects is converted to the shorter (narrower) pitch CPTC1 there, and the signals are transferred to the third interconnect group 263.

In the pitch conversion-use interconnect region 260, when applied to for example the row decoder 30, the flow of signals is as follows: The signals are transferred from the third interconnect group 263 to the slanted interconnect group 262, the pitch CPTC1 of interconnects is converted to the longer (broader) pitch OPTC1 here, and the signals are transferred to the first interconnect group 261.

Further, in the first embodiment, as shown in FIG. 6, it is also possible to provide a bent interconnect group 264 having bent interconnects FR formed therein after the position where the pitch between interconnects is converted in the pitch conversion-use interconnect region 260. Due to this, it becomes possible to bend the interconnects in the lower layer after converting the pitch by the pitch conversion interconnects and transmit the signals to the vicinity of the chip-to-chip vias.

Due to this, it becomes possible to make the orientations of flow of the signals of the column signal chains 80-1 and 80-2 the same. Further, in the column signal chain 80, it is possible to arrange the input terminal in either of the side portion OTS on the outer side of the column output direction (Y-direction) or the side portion INS on the inner side. However, when it is arranged in the side portion OTS on the outer side, it becomes possible to cope with the arrangement by bending the interconnects in the lower layer in place of the metal interconnect layer in the pitch conversion-use interconnect region 260A.

Further, in the first embodiment, the pitch conversion-use interconnect region 260-3 including slanted interconnects is formed between an end part 803T of the column signal chain 80-2 having the third pitch PTC3 shorter than the first pitch PTC1 of the pixel part 20 and one end part 222T1 of the column level connection part 222. The pitch conversion-use interconnect region 260-4 including slanted interconnects is formed between an end part 804T of the column signal chain 80-2 having the third pitch PTC3 shorter than the first pitch PTC1 of the pixel part 20 and the other end part 222T2 of the column level connection part 222. The slanted interconnects in the pitch conversion-use interconnect regions 260-3 and 260-4 are individually laid from the end parts 222T1 and 222T2 of the column level connection part 222 up to the positions which match the positions of the end parts 803T and 804T of the column signal chain 80-2.

Figure 7:
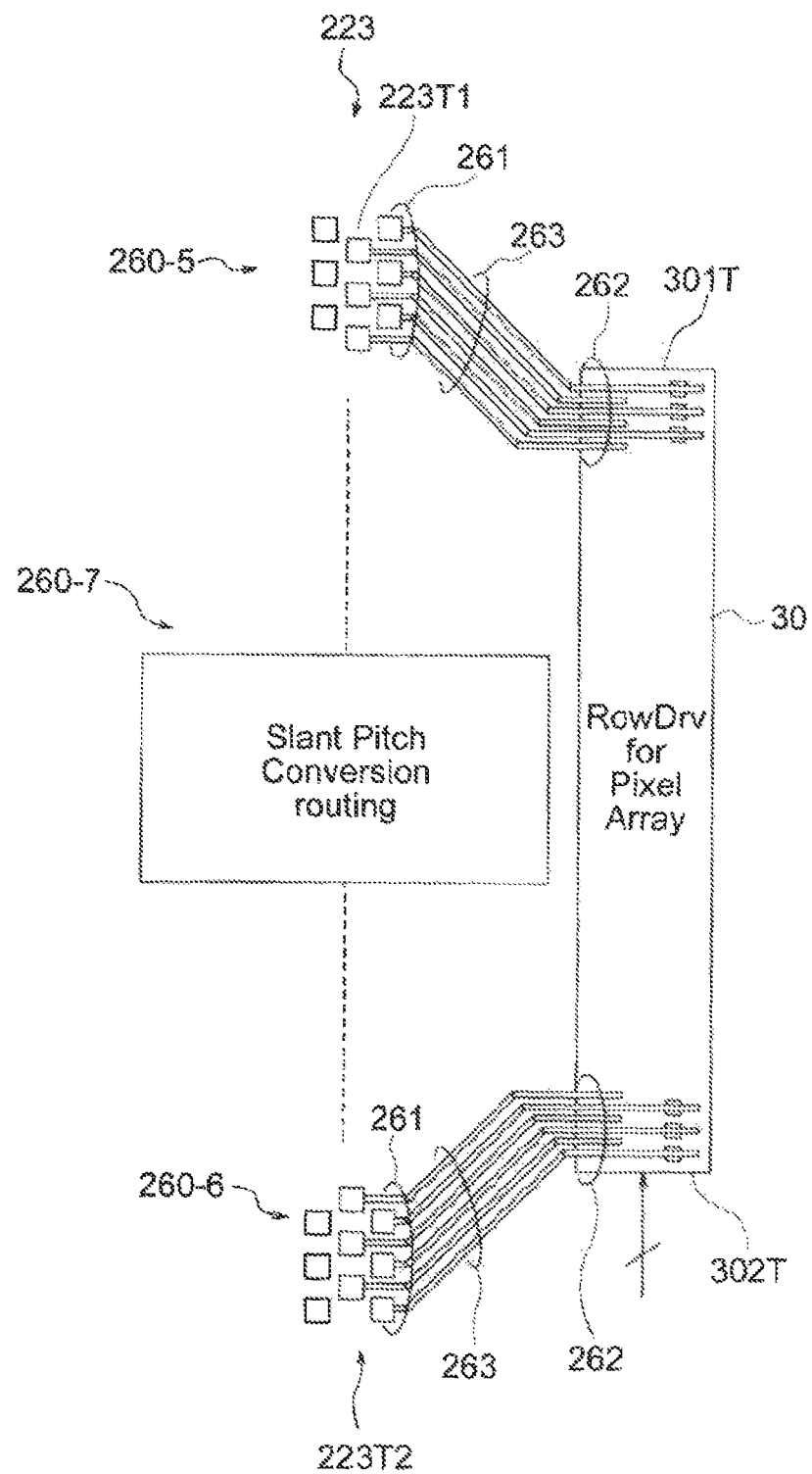
FIG. 7 is a diagram showing an example of the configuration of the pitch conversion-use interconnect region including the slanted interconnect related to a row decoder according to the first embodiment of the present invention.

FIG. 7 is a diagram showing an example of the configuration of a pitch conversion-use interconnect region including slanted interconnects related to the row decoder 30 according to the first embodiment of the present invention.

In the first embodiment, the pitch conversion-use interconnect region 260-5 including the slanted interconnects is formed between an end part 301T of the row decoder 30 having the fourth pitch PTC4 shorter than the second pitch PTC2 of the pixel part 20 and one end part 223T1 of the column level connection part 223. The pitch conversion-use interconnect region 260-6 including the slanted interconnects is formed between an end part 302T of the row decoder 30 having the fourth pitch PTC4 shorter than the second pitch PTC2 of the pixel part 20 and one end part 223T2 of the cob=level connection part 223. The slanted interconnects in the pitch conversion-use interconnect regions 260-5 and 260-6 are individually laid from the end parts 223T1 and 223T2 of the column level connection part 223 up to the positions which match with the positions of the end parts 301T and 302T of the row decoder 30.

Note that, the pitch conversion-use interconnect region 260-7 is formed by using an interconnect layer which is different from the metal interconnect layer used for the row driver 30 and is shown as one example capable of arrangement so as to overlap the row driver 30 in the stacking direction (Z-direction).

As explained above, the solid-state imaging device 10 in the first embodiment has a multilayer structure comprised of the first substrate 110 and the second substrate 120 connected by for example stacking-use vias between chips (die-to-die vias) or micro-bumps through the column level connection parts 211 and 212 and the column level connection parts 221 and 222 which are individually formed on the substrates and correspond to each other and through their row level connection part 213 and row level connection part 223 corresponding to each other. On the first substrate 110, the pixel part 20 is formed. Further, in the pixel part 20, the side portions 231 and 232 along the column level connection parts 211 and 212 of the column output direction have the first pitch PTC1, and the side portion 233 along the row level connection part 213 of the direction perpendicular to the column output direction has the second pitch PTC2. On the second substrate 120, along the column level connection parts 221 and 222, the column signal chains 80-1 and 80-2 including the column readout circuits 40 with side portions 241 and 242 of the column output direction having the third pitch PTC3 corresponding to the first pitch PTC1 of the pixel part 20 are formed, while along the row level connection part 223, the row driver 30 with the side portion 251 of the direction perpendicular to the column output direction having the fourth pitch PTC4 corresponding to the second pitch PTC2 is formed. On the second substrate 120, the pitch conversion-use interconnect regions 260 (−1~−7) including the slanted interconnects for the pitch conversion among interconnects are formed. Further, in the first embodiment, both of the third pitch PTC3 of the column signal chains 80 on the second substrate 120 and the fourth pitch PTC4 of the row driver 30 are set shorter than the corresponding first pitch PTC1 and second pitch PTC2 of the pixel part 20 on the first substrate. Further, the pitch conversion-use interconnect region 260 is formed between the end part of the column signal chains 80 having the third pitch PTC3 shorter than the pixel part 20 and the end part of the column level connection part 221 or 222 or between the end part of the row driver 30 having the fourth pitch PTC4 shorter than the pixel part 20 and the end part of the row level connection part 223. Further, the column signal chains 80 or row driver 30 or both and the pitch conversion-use interconnect regions 260 are arranged so that they overlap each other.

Accordingly, according to the solid-state imaging device 10 in the first embodiment, it is possible to realize the smallest chip projection area which can be realized by an image sensor with an equal size to the pixel array. As a result, there are the advantages that further miniaturization of cameras is pi-climbed and that application to fields of products such as wearable apparatuses where mounting was conventionally difficult becomes possible.

More specifically, conventionally a chip projection area broader than the pixel array was necessary. However, it becomes possible to realize the smallest chip projection area which can be realized by an image sensor with an equal size to the pixel array. Further, even if configured by several column signal chains, the speed can be raised without increasing the chip projection area. Further, the orientations of flow of signal processing can be made the same wrong the plurality of column signal chains. Further, it is possible to realize a reduction of manufacturing costs and specialization of processing techniques due to use of single channels in the first substrate (CIS die).

Further, according to the solid-state imaging device 10 in the first embodiment, a reduction of area efficiency in layout can be prevented while preventing complication of the configuration.

Further, the solid-state imaging device 10 according to the present first embodiment has the multilayer structure of the first substrate (upper substrate) 110 and the second substrate (lower substrate) 120. Accordingly, in the first embodiment, basically, by forming the first substrate 110 side by only nMOS elements and by enlarging the effective pixel region to the maximum limit by the pixel array, the value per cost can be raised up to the maximum limit.

Further, there is no necessity of mounting transistors other than the pixels comprised of nMOS's on the first substrate (CIS die) 110. Therefore, as in the CCD image sensor, use of single channels on the first substrate (CIS die) 110 can be promoted. As a result, the number of lithography-use optical masks which became necessary at the time of manufacture is greatly decreased, whereby the effects of reducing the manufacturing costs and tailoring the process for improving the pixel characteristics can be obtained as well.

Second Embodiment

Figure 8:
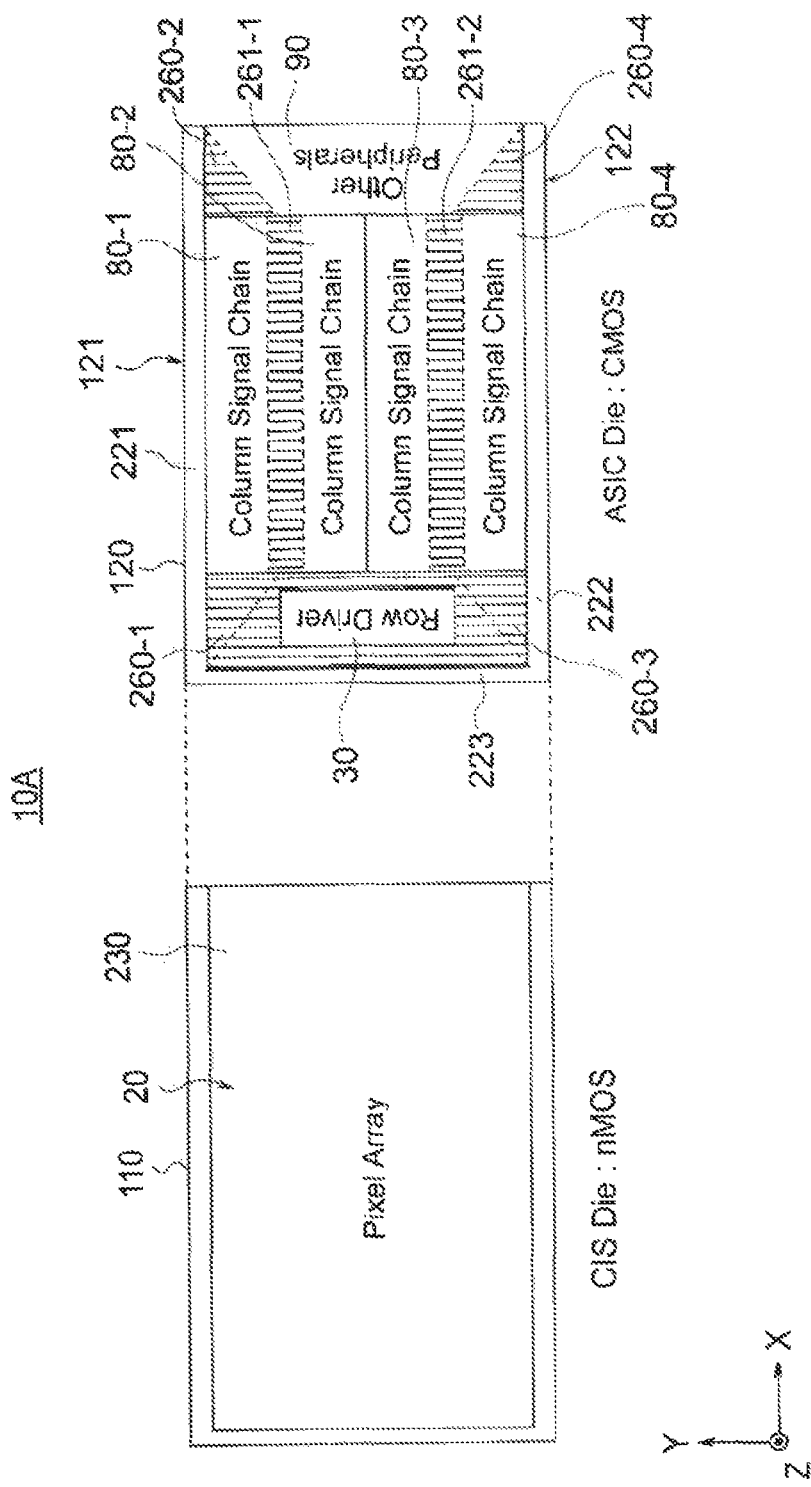
FIG. 8 is a diagram for explaining a multilayer structure of a solid-state imaging device according to a second embodiment of the present invention.

FIG. 8 is a diagram for explaining a multilayer structure of a solid-state imaging device 10A according to a second embodiment of the present invention.

The difference of the solid-state imaging device 10A according to the second embodiment from the solid-state imaging device 10 according to the first embodiment explained above is as follows. In the solid-state imaging device 10A according to the second embodiment, between the two side portions 121 and 122 outside of the column output direction (Y-direction) on the second substrate 120, four column signal chains 80-1, 80-2, 80-3, and 80-4 having a third pitch PTC3 shorter than the first pitch PTC1 of the pixel part 20 are formed. Further, the pitch conversion-use interconnect regions 260 include expanded interconnect regions 261 which are arranged on the side portion sides where the input terminals of the column signal chains 80-1, 80-2, 80-3, and 80-4 are formed and are expanded so that the interconnects after pitch conversion are connected to the input terminals.

In the solid-state imaging device 10A according to the second embodiment, the neighboring two column signal chains 80-1 and 80-2 and the neighboring column signal chains 80-3 and 80-4 are arranged so that their side portion sides where the input terminals are formed face each other. One expanded interconnect region 261-1 is shared by two column signal chains 80-1 and 80-2, and one expanded interconnect region 261-2 is shared by the column signal chains 80-3 and 80-4.

Note that, in the expanded interconnect regions 261-1 and 261-2, the interconnects may be arranged so that the orientations of flow of signals through the two sets, i.e., two column signal chains 80-1 and 80-2 and two column signal chains 80-3 and 80-4 became the same as well.

According to the second embodiment, not only can the same effects as the effects by the first embodiment explained above be obtained, but also the area of the second substrate (ASIC die) 120 can be effectively utilized by arranging the column signal chains 80 without a gap, therefore it becomes possible to realize a higher speed without increasing the projection area of the image sensor (footprint), that is, while keeping the projection area equal to the pixel array.

Third Embodiment

Figure 9:
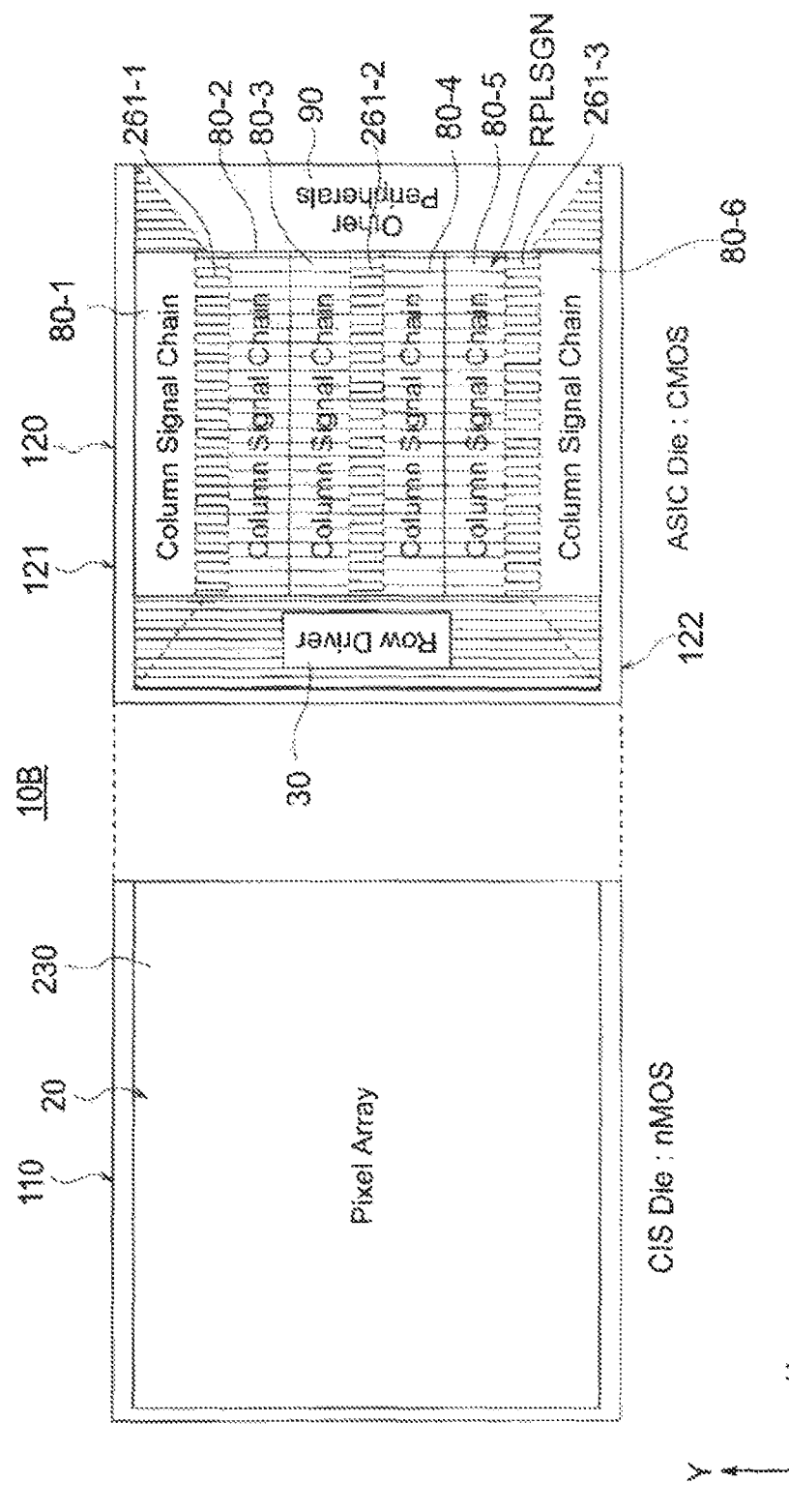
FIG. 9 is a diagram for explaining a multilayer structure of a solid-state imaging device according to a third embodiment of the present invention.

FIG. 9 is a diagram for explaining a multilayer structure of a solid-state imaging device 10B according to a third embodiment of the present invention.

The difference of the solid-state imaging device 10B according to the third embodiment from the solid-state imaging device 10A according to the second embodiment explained above is as follows. In the solid-state imaging device 10B according to the third embodiment, between the two side portions 121 and 122 on the outside of the column output direction (Y-direction) of the second substrate 120, six column signal chains 80-1, 80-2, 80-3, 80-4, 80-5, and 80-6 having a third pitch PTC3 shorter than the first pitch PTC1 of the pixel part 20 are formed. Further, the expanded interconnect regions 261-1, 261-2, and 261-3 are arranged so as to be connected to the input terminals of all column signal chains 80-1, 80-2, 80-3, 80-4, 80-5, and 80-6. In the solid-state imaging device 10B according to the third embodiment, on the second substrate 120, a replica signal line RPLSGN obtained by changing the interconnect pitch of the vertical signal line LSGN is arranged so as to overlap the region of arrangement of the plurality of column signal chains 80-1, 80-2, 80-3, 80-4, 80-5, and 80-6. By the replica signal line PRLSGN, the interconnects after the pitch conversion are connected to all of the column signal chains 80-1, 80-2, 80-3, 80-4, 80-5, and 80-6.

According to the third embodiment, not only can the sane effects as the effects by the second embodiment explained above be obtained, but also the following effects can be obtained. The parallelism of the column signal chains 80 can be improved, and it becomes possible to realize further higher speed. Further, for example, even with respect to a pixel array 230 having an aspect ratio of a square, the column signal chains 80 can be spread over the entire region just under the sane. Therefore, even in a case where the pixel formats of the pixel array are different, the configuration of the present image sensor is effective.

Fourth Embodiment

Figure 10:
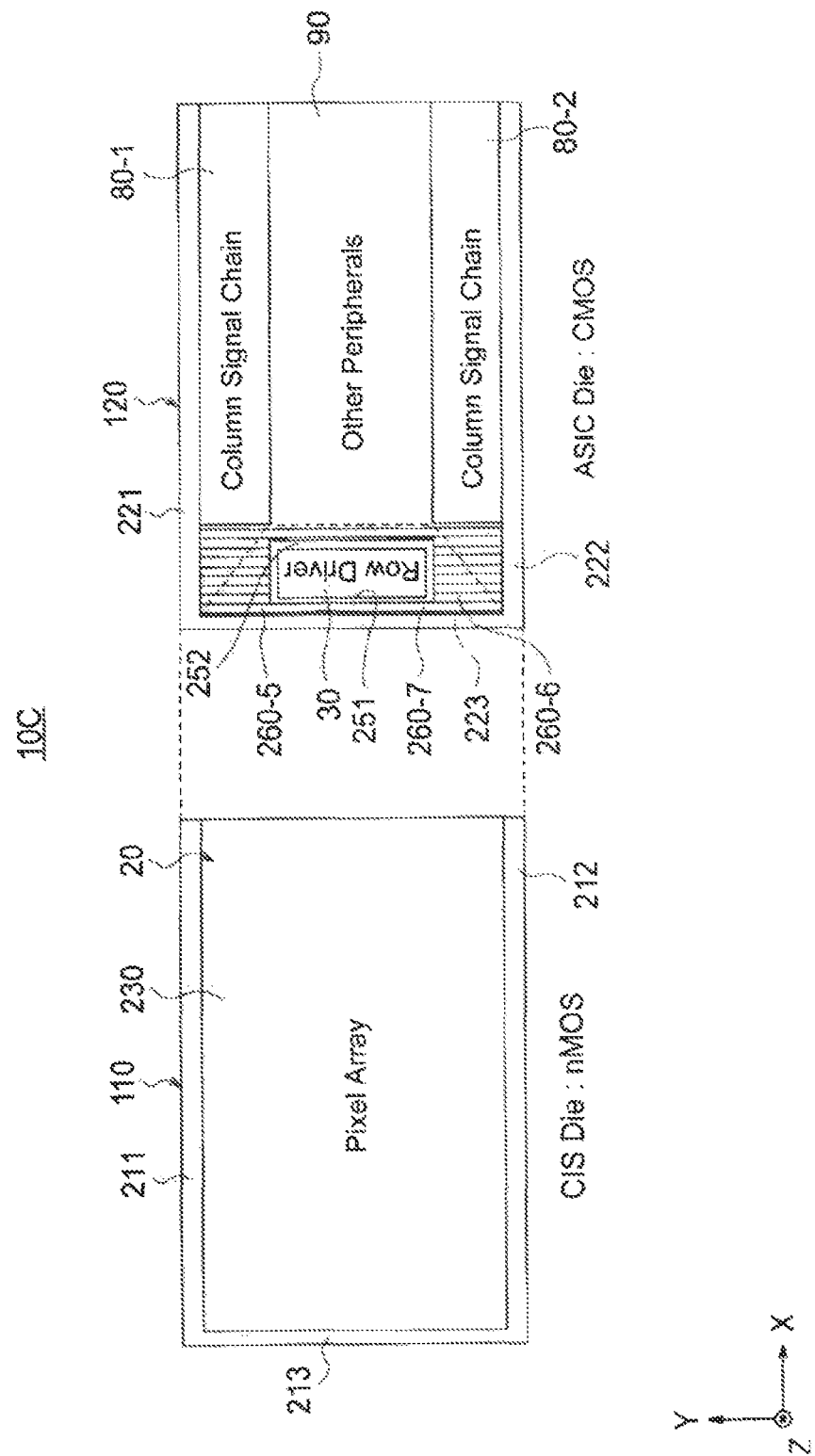
FIG. 10 is a diagram for explaining a multilayer structure of a solid-state imaging device according to a fourth embodiment of the present invention.

FIG. 10 is a diagram for explaining a multilayer structure of a solid-state imaging device 10C according to a fourth embodiment of the present invention.

The difference of the solid-state imaging device 10C according to the fourth embodiment from the solid-state imaging device 10 according to the first embodiment explained above is as follows. In the solid-state imaging device 10C according to the fourth embodiment, the pitch PTC3 of the column signal chains 80-1 and 80-2 is set the sane as the corresponding first pitch PTC1 of the pixel part 20 on the first substrate 110. Further, the output terminal of the row driver 30 is formed on a side portion 252 side on the inner side between a side portion 251 on the outer side and the side portion 252 on the inner side of the direction (X-direction) perpendicular to the column output direction.

According to the fourth embodiment, not only can the sane effects as the effects by the first embodiment explained above be obtained, but also the following effects can be obtained. The column signal chains are arranged with the sane pitch as the pixel part, therefore the pitch conversion-use interconnect region (routing region) is unnecessary. The row driver 30 is connected to the row level connection part 223 by using the pitch conversion-use interconnect region. At this time, however, a portion of the column signal chains and the upper layer or lower layer of the row driver 30 itself end up being laid, but physical interference can be avoided by using a newly added metal layer. By arranging the output terminal of the row driver 30 in the side portion 252 on the inner side, the interconnect can be realized without using bent interconnects in the interconnect region. Further, by these configurations, reuse etc. is promoted without changing the column circuit even with respect to pixels having a very fine pitch, and design of the column signal chains lowering the pitch down to an unrealizable extent becomes unnecessary. On the other hand, usually the row driver 30 is a digital circuit performing a closed loop operation which does not need various capacitors (MIM or polycapacitor) etc., therefore design is generally possible even if the pixel pitch is fine.

Fifth Embodiment

Figure 11:
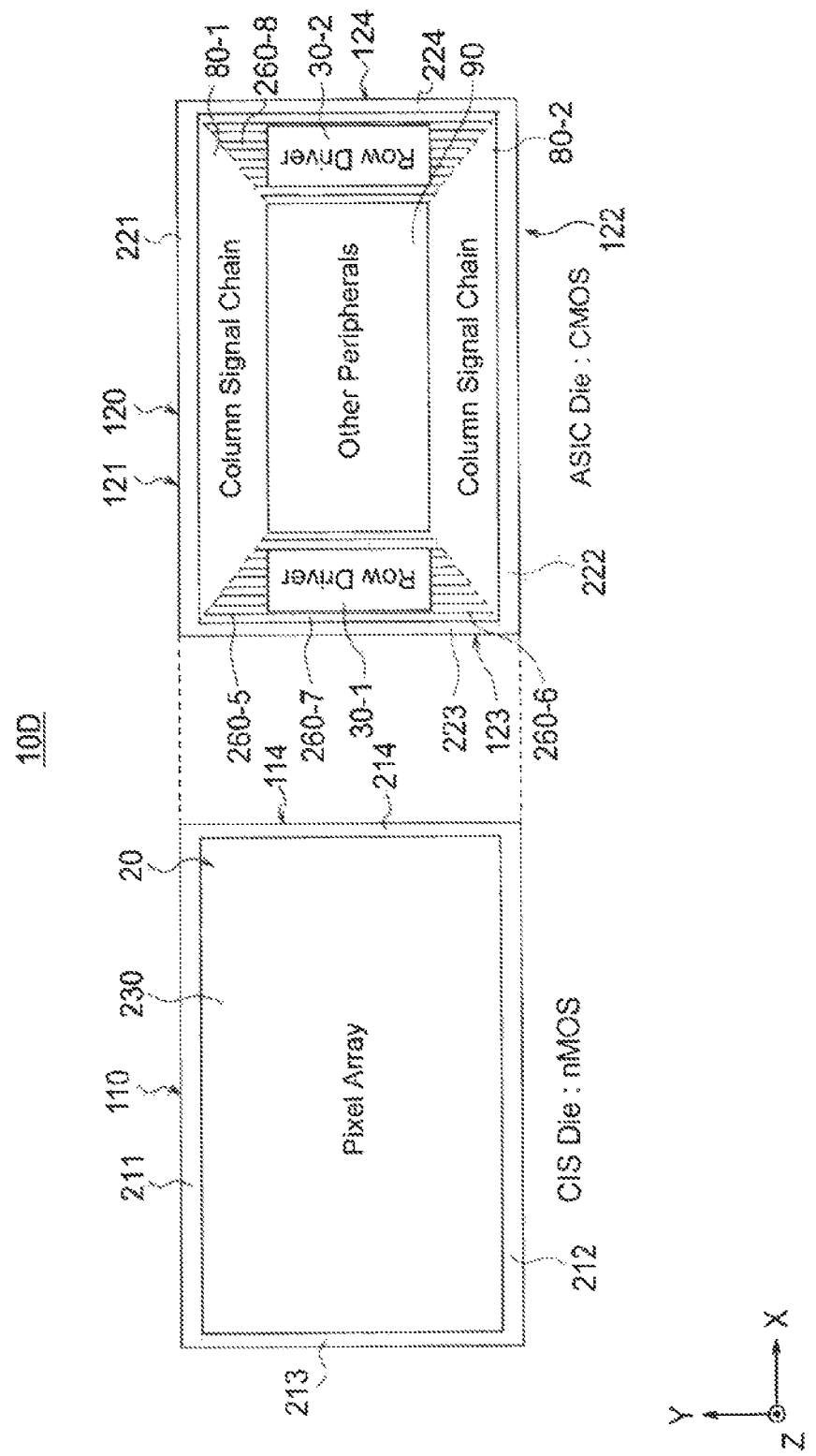
FIG. 11 is a diagram for explaining a multilayer structure of a solid-state imaging device according to a fifth embodiment of the present invention.

FIG. 11 is a diagram for explaining a multilayer structure of a solid-state imaging device 10D according to a fifth embodiment of the present invention.

The difference of the solid-state imaging device 10D according to the fifth embodiment from the solid-state imaging device 10C according to the fourth embodiment explained above is as follows. In the solid-state imaging device 10D according to the fifth embodiment, two row drivers 30-1 and 30-2 are individually formed along two side portions 123 and 124 of the direction (X-direction) perpendicular to the column output direction of the second substrate 120. Further, a row level connection part 224 is formed in the side portion 124 of the second substrate 120, and a row level connection part 214 is formed in the side portion 114 of the first substrate 110. The two row drivers 30-1 and 30-2 may drive the sane row or may be separately used for odd number rows and even number rows.

According to the fifth embodiment, the sane effects as the effects by the fourth embodiment explained above can be obtained.

Sixth Embodiment

Figure 12:
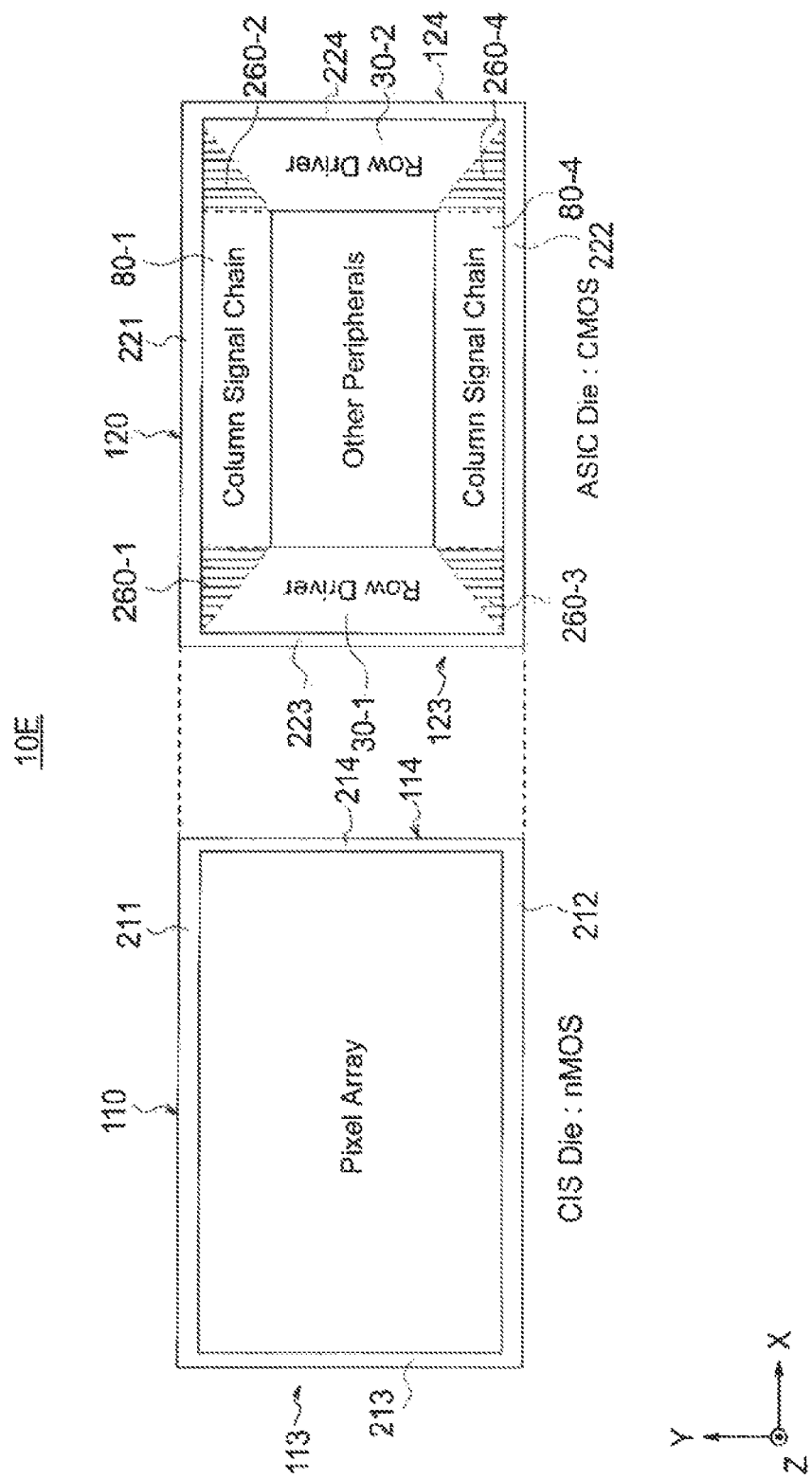
FIG. 12 is a diagram for explaining a multilayer structure of a solid-state imaging device according to a sixth embodiment of the present invention.

FIG. 12 is a diagram for explaining a multilayer structure of a solid-state imaging device 10E according to a sixth embodiment of the present invention.

The difference of the solid-state imaging device 10E according to the sixth embodiment from the solid-state imaging device 10 according to the first embodiment explained above is as follows. In the solid-state imaging device 10E according to the sixth embodiment, two row drivers 30-1 and 30-2 are individually formed along the two side portions 123 and 124 of the direction (X-direction) perpendicular to the column output direction of the second substrate 120. Further, a row level connection part 224 is formed in the side portion 124 of the second substrate 120, and a row level connection part 214 is formed in the side portion 114 of the first substrate 110. The two row drivers 30-1 and 30-2 may drive the same row or may be separately used for odd number rows and even number rows.

According to the sixth embodiment, the sane effects as the effects by the first embodiment explained above can be obtained. Further, the circuit configuration of the column signal chains is simple, therefore it is the most effective node when miniaturization can be carried out.

Seventh Embodiment

Figure 13:
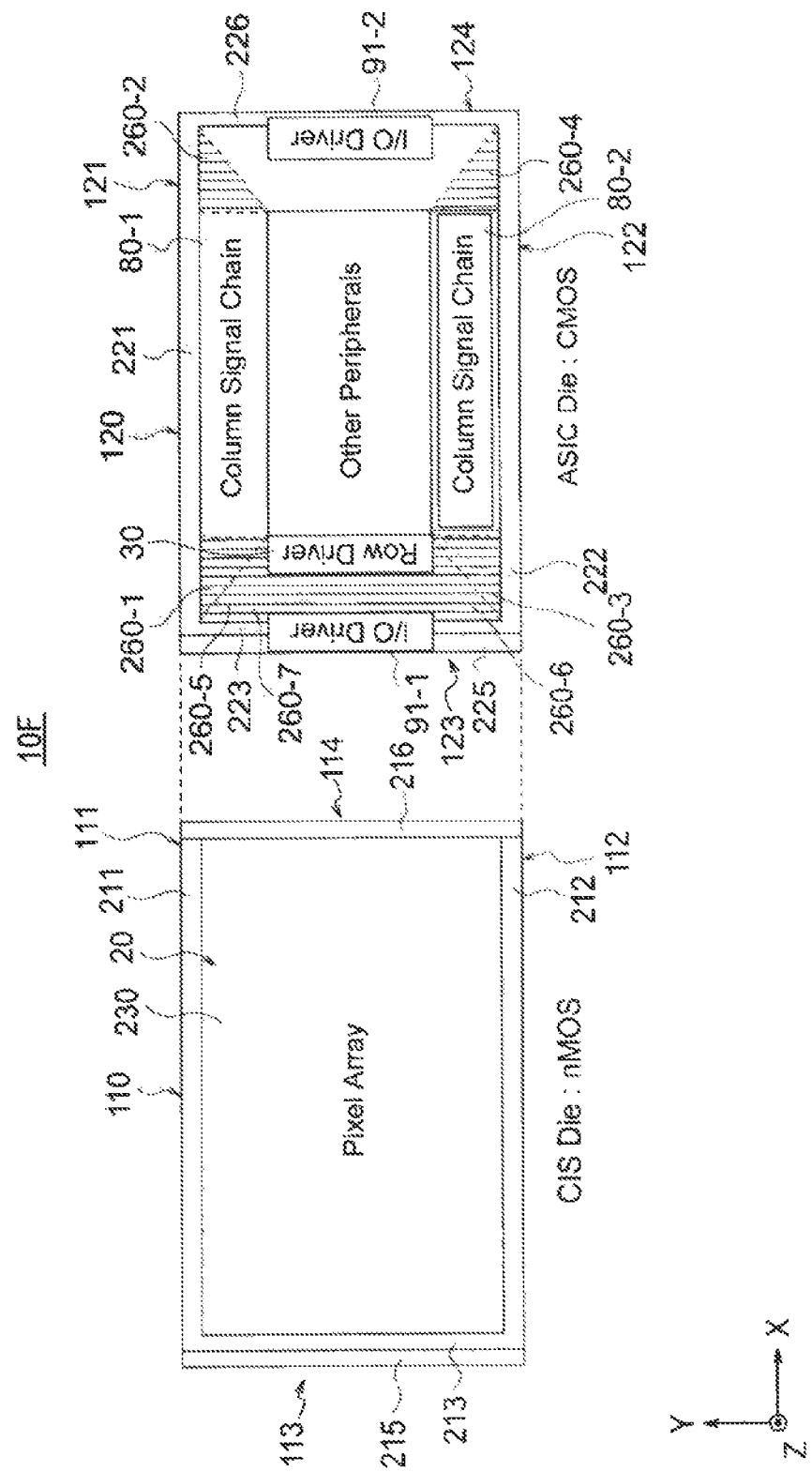
FIG. 13 is a diagram for explaining a multilayer structure of a solid-state imaging device according to a seventh embodiment of the present invention.

FIG. 13 is a diagram for explaining a multilayer structure of a solid-state imaging device 10F according to a seventh embodiment of the present invention.

The difference of the solid-state imaging device 10F according to the seventh embodiment from the solid-state imaging device 10 according to the first embodiment explained above is as follows. In the solid-state imaging device 10F according to the seventh embodiment, two input/output (I/O) row drivers 91-1 and 91-2 having the same pitch as the row driver 30 are individually formed along the two side portions 123 and 124 of the direction (X-direction) perpendicular to the column output direction of the second substrate 120. Further, I/O level connection parts 225 and 226 are formed in the side portions 123 and 124 of the second substrate 120, and I/O level connection parts 215 and 216 are formed in the side portions 113 and 114 of the first substrate 110.

According to the seventh embodiment, the sane effects as the effects by the first embodiment explained above can be obtained. Further, an I/O pad is mounted on the first substrate (CIS die) 110. However, an I/O pad is generally about 60 to 100 µm square, therefore the influence of the mount of increase of the lateral width is small in comparison with the pixel array width. Rather, the mount of increase of the lateral width of the chip can be suppressed by superimposing an I/O driver having a relatively large area (particularly high speed interface I/O circuit) on the I/O pad.

The solid-state imaging devices 10 and 10A to 10F explained above can be applied as imaging devices to digital cameras, video cameras, portable terminals, or monitoring cameras, cameras for medical endoscopes, and other electronic apparatuses.

Figure 14:
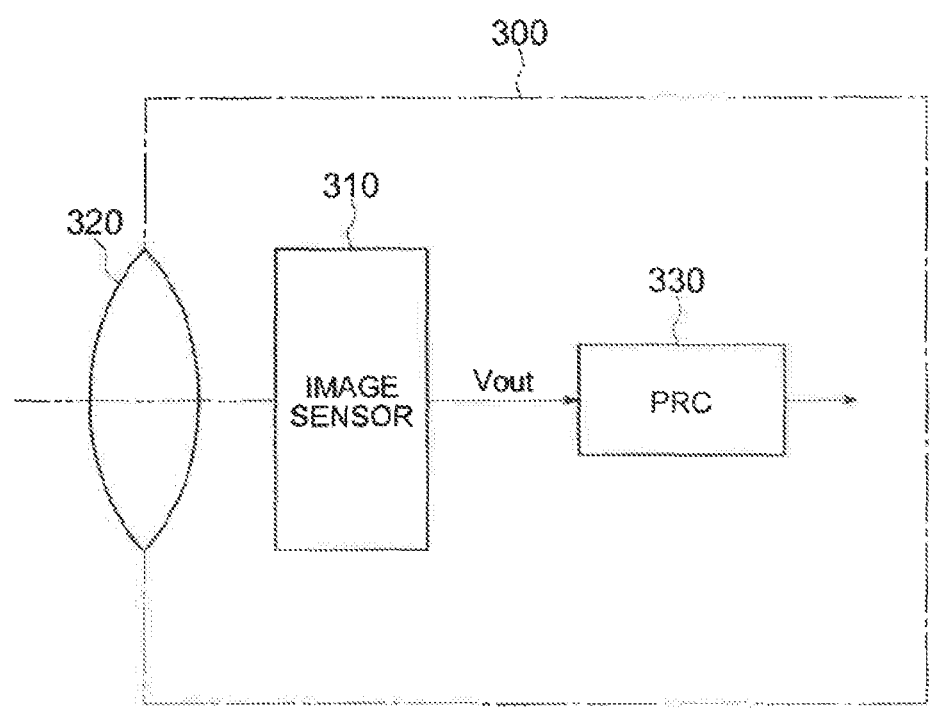
FIG. 14 is a diagram showing an example of the configuration of an electronic apparatus to which the solid-state imaging device according to the embodiment of the present invention is applied.

FIG. 14 is a diagram showing an example of the configuration of an electronic apparatus mounting the camera system to which the solid-state imaging device according to embodiments of the present invention is applied.

The electronic apparatus 300, as shown in FIG. 14, has a CMOS image sensor 310 to which the solid-state imaging device 10 according to the present embodiment can be applied. Further, the electronic apparatus 300 has an optical system (lens etc.) 320 guiding the incident light to the pixel region of this CMOS image sensor 310 (forming a subject image). The electronic apparatus 300 has a signal processing circuit (PRC) 330 for processing output signals of the CMOS image sensor 310.

The signal processing circuit 330 applies predetermined signal processing with respect to the output signals of the CMOS image sensor 310. The image signals processed in the signal processing circuit 330 are projected as a moving picture in a monitor configured by a liquid display etc. or can be output to a printer. Further, various aspects are possible such as direct recording in a recording medium such as a memory card.

As explained above, by mounting the solid-state imaging devices 10 and 10A to 10F as the CMOS image sensor 310, it becomes possible to provide a high performance, small-sized, and low cost camera system. Further, it is possible to realize for example a monitoring camera or camera for medical endoscopes or other electronic apparatus which is used for applications where there are restrictions in mounting size, number of connectable cables, cable length, installation height, etc. in requirements for camera installation.

The invention claimed is:

1. A solid-state imaging device comprising
 a pixel part having a plurality of pixels performing photoelectric conversion arranged in a matrix,
 a reading part reading pixel signals from the pixel part to a column output direction,
 a first substrate, and
 a second substrate, wherein
 the reading part includes at least
 a row driver which drives a row designated in the pixel part so as to read out pixel signals in the row to the column output direction and
 a column readout circuit applying predetermined signal processing with respect to the pixel signals read out in response to driving of the row driver,
 the first substrate and the second substrate have a multilayer structure in which they are connected through a column level connection part which is formed in at least one side portion of the column output direction of each substrate and through a row level connection part which is formed in at least one side portion of a direction perpendicular to the column output direction of each substrate, on the first substrate, a pixel part is formed, in which pixel part, the side portion along the column level connection part of the column output direction has a first pitch, and the side portion long the row level connection part of the direction perpendicular to the column output direction has a second pitch, on the second substrate, at least, the column readout circuit with a side portion of the column output direction having a third pitch corresponding to the first pitch is formed along the column level connection part, and the row driver with a side portion of the direction perpendicular to the column output direction having a fourth pitch corresponding to the second pitch is formed along the row level connection part, and a pitch conversion-use interconnect region including a slanted interconnect for pitch conversion between interconnects is formed, at least one of the third pitch of the column readout circuit or the fourth pitch of the row driver on the second substrate is shorter than a corresponding first pitch or second pitch of the pixel part on the first substrate, and the pitch conversion-use interconnect region is formed at least between an end part of the column readout circuit having the third pitch shorter than the pixel part and an end part of the column level connection part and/or between an end part of the row driver having the fourth pitch shorter than the pixel part and an end part of the row level connection part.

2. The solid-state imaging device according to claim 1, wherein in the pitch conversion-use interconnect region, slanted interconnects are laid from the end part of the column level connection part up to positions matching positions of two ends of the column readout circuit and/or laid from the end part of the row level connection part up to positions matching positions of two ends of the row driver.

3. The solid-state imaging device according to claim 1, wherein in the pitch conversion-use interconnect region, bent interconnects are formed after converting the pitch wrong the interconnects by the pitch conversion interconnects.

4. The solid-state imaging device according to claim 1, wherein the pitch conversion-use interconnect region is arranged so as to overlap the column readout circuit and/or row driver in different interconnect layers.

5. The solid-state imaging device according to claim 1, wherein in the column readout circuit having a third pitch shorter than the first pitch of the pixel part, an input terminal is formed in one side portion between a side portion on an outer side and a side portion on an inner side of the column output direction of the column readout circuit.

6. The solid-state imaging device according to claim 5, wherein:

in the column readout circuit, the input terminal is formed in the side portion on the outer side of the column output direction, and in the pitch conversion-use interconnect region, bent interconnects are formed after converting the pitch among the interconnects by an interconnect layer which is different from an interconnect layer for the column readout circuit.

7. The solid-state imaging device according to claim 5, wherein:

a plurality of column readout circuits having the third pitch shorter than the first pitch of the pixel part are formed between two side portions of the column output direction of the second substrate, and, in the pitch conversion-use interconnect region, it includes an expanded interconnect region which is arranged on a side portion side where the input terminal of the column readout circuit is formed and is expanded so that the interconnects after the pitch conversion are connected to the input terminal.

8. The solid-state imaging device according to claim 7, wherein neighboring two column readout circuits are arranged so that their side portion sides where the input terminals are formed face each other, and one expanded interconnect region is shared by the two column readout circuits.

9. The solid-state imaging device according to claim 8, wherein in the expanded interconnect region, the interconnects are arranged so that orientations of flow of signals through the two column readout circuits become the same.

10. The solid-state imaging device according to claim 7, wherein the expanded interconnect region is arranged so as to be connected to the input terminals of all of column readout circuits.

11. The solid-state imaging device according to claim 10, wherein:

on the first substrate, the pixel signals are read out from the pixel part to a signal line arranged in the column output direction, and, on the second substrate, a replica signal line obtained by changing the interconnect pitch of the signal line is arranged so as to overlap the interconnect region of the plurality of column readout circuits, and the interconnects after the pitch conversion are connected to all of the column readout circuits by the replica signal line.

12. The solid-state imaging device according to claim 1, wherein:

a fourth pitch of the row driver is shorter than the corresponding second pitch of the pixel part on the first substrate, and an output terminal of the row driver is formed on a side portion side on an inner side between a side portion on an outer side and the side portion on the inner side of the direction perpendicular to the column output direction.

13. The solid-state imaging device according to claim 1, wherein:

the fourth pitch of the row driver is shorter than the corresponding second pitch of the pixel part on the second substrate, and two row drivers are individually formed along two side portions of the direction perpendicular to the column output direction on the second substrate.

14. The solid-state imaging device according to claim 1, wherein:

the fourth pitch of the row driver is shorter than the corresponding second pitch of the pixel part on the second substrate, an input/output driver is formed along at least one side portion of the direction perpendicular to the column output direction on the second substrate so that it is parallel to the row driver, and, the input/output driver is connected to a second substrate side input/output level connection part formed in at least one side portion of the direction perpendicular to the column output direction on the second substrate, and the input/output level connection part on the second substrate side is connected to a first substrate side input/output level connection part formed in at least one side portion of the direction perpendicular to the column output direction on the first substrate.

15. A method for manufacturing a solid-state imaging device comprising
   a pixel part having a plurality of pixels performing photoelectric conversion arranged in a matrix,
   a reading part reading pixel signals from the pixel part to an column output direction,
   a first substrate, and
   a second substrate, wherein
   the reading part includes at least
   a row driver which drives a row designated in the pixel part so as to read out the pixel signals in the row to the column output direction and
   a column readout circuit applying predetermined signal processing with respect to the pixel signals read out in response to driving of the row driver, and
   the first substrate and the second substrate have a multi-layer structure in which they are connected through a column level connection part which is formed in at least one side portion of the column output direction of each substrate and through a row level connection part which is formed in at least one side portion of a direction perpendicular to the column output direction of each substrate,
   the method for manufacturing a solid-state imaging device comprising,
   on the first substrate,
   forming a pixel part with a side portion along the column level connection part of the column output direction having a first pitch and with a side portion along the row level connection part of the direction perpendicular to the column output direction having a second pitch,
   processing the second substrate to at least
   form along the column level connection part a column readout circuit with a side portion of the column output direction having a third pitch corresponding to the first pitch,
   forming along the row level connection part a row driver with a side portion of the direction perpendicular to the column output direction having a fourth pitch corresponding to the second pitch,
   forming a pitch conversion-use interconnect region including a slanted interconnect for pitch conversion between interconnects, and
   making at least one of the third pitch of the column readout circuit or the fourth pitch of the row driver on the second substrate shorter than the corresponding first pitch or second pitch of the pixel part on the first substrate, and
   forming the pitch conversion-use interconnect region at least between an end part of the column readout circuit having the third pitch shorter than the pixel part and an end part of the column level connection part, and/or between an end part of the row driver having the fourth pitch shorter than the pixel part and an end part of the row level connection part.

16. An electronic apparatus comprising
   a solid-state imaging device and
   an optical system forming a subject image in the solid-state imaging device, wherein
   the solid-state imaging device comprises
   a pixel part having a plurality of pixels performing photoelectric conversion arranged in a matrix,
   a reading part reading pixel signals from the pixel part to a column output direction,
   a first substrate, and
   a second substrate,
   the reading part includes at least
   a row driver which drives a row designated in the pixel part so as to read out the pixel signals in the row to the column output direction and
   a column readout circuit applying predetermined signal processing with respect to the pixel signals read out in response to driving of the row driver,
   the first substrate and the second substrate have a multi-layer structure in which they are connected through a column level connection part which is formed in at least one side portion of the column output direction of each substrate and through a row level connection part which is formed in at least one side portion of a direction perpendicular to the column output direction of each substrate,
   on the first substrate,
   a pixel part is formed, in which pixel part, the side portion along the column level connection part of the column output direction has a first pitch, and the side portion along the row level connection part of the direction perpendicular to the column output direction has a second pitch,
   on the second substrate, at least,
   a column readout circuit with a side portion of the column output direction having a third pitch corresponding to the first pitch is formed along the column level connection part,
   a row driver with a side portion of a direction perpendicular to the column output direction having a fourth pitch corresponding to the second pitch is formed along the row level connection part,
   a pitch conversion-use interconnect region including a slanted interconnect for pitch conversion between interconnects is formed,
   at least one of the third pitch of the column readout circuit or the fourth pitch of the row driver on the second substrate is shorter than a corresponding first pitch or second pitch of the pixel part on the first substrate, and
   the pitch conversion-use interconnect region is formed at least between an end part of the column readout circuit having the third pitch shorter than the pixel part and an end part of the column level connection part and/or between an end part of the row driver having the fourth pitch shorter than the pixel part and an end part of the row level connection part.

\* \* \* \* \*